United States Patent
Fukuda et al.

(10) Patent No.: US 7,572,037 B2
(45) Date of Patent: Aug. 11, 2009

(54) LIGHT EMITTING DEVICE, DISPLAY DEVICE AND A METHOD OF MANUFACTURING DISPLAY DEVICE

(75) Inventors: Toshihiro Fukuda, Kanagawa (JP); Jiro Yamada, Kanagawa (JP); Nobutoshi Asai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/043,270

(22) Filed: Mar. 6, 2008

(65) Prior Publication Data
US 2008/0219005 A1 Sep. 11, 2008

(30) Foreign Application Priority Data
Mar. 7, 2007 (JP) ............... 2007-056598

(51) Int. Cl.
*F21V 33/00* (2006.01)
(52) U.S. Cl. .................... 362/347; 362/296.1; 362/341; 362/800
(58) Field of Classification Search ............ 362/296.1, 362/297, 304, 341, 346, 347, 612, 555, 545, 362/800
See application file for complete search history.

(56) References Cited

U.S. PATENT DOCUMENTS

| 4,742,432 A | * | 5/1988 | Thillays et al. | 361/783 |
| 6,614,103 B1 | * | 9/2003 | Durocher et al. | 257/678 |
| 6,874,910 B2 | * | 4/2005 | Sugimoto et al. | 362/294 |
| 6,964,489 B2 | * | 11/2005 | Blume et al. | 362/27 |
| 2005/0073827 A1 | * | 4/2005 | Li | 362/29 |

FOREIGN PATENT DOCUMENTS

| JP | 2002-184567 | 6/2002 |
| JP | 2003-077648 | 3/2003 |
| JP | 2005-531102 | 10/2005 |

* cited by examiner

*Primary Examiner*—Laura Tso
(74) *Attorney, Agent, or Firm*—Sonnenschein Nath & Rosenthal LLP

(57) ABSTRACT

Disclosed herein is a light emitting device, which includes a light emitting element configured to emit a light, and a concave mirror portion configured to reflect the light emitted from the light emitting element, the concave mirror portion being erected on a circumference of an emission surface of the light emitting element. The concave mirror portion has a light reflecting surface obtained by rotating a part of a parabola. A central axis of the rotation is set in a position of passing through a side of the parabola with respect to a middle point of a line segment joining the part of the parabola and a focal point of the parabola.

7 Claims, 13 Drawing Sheets

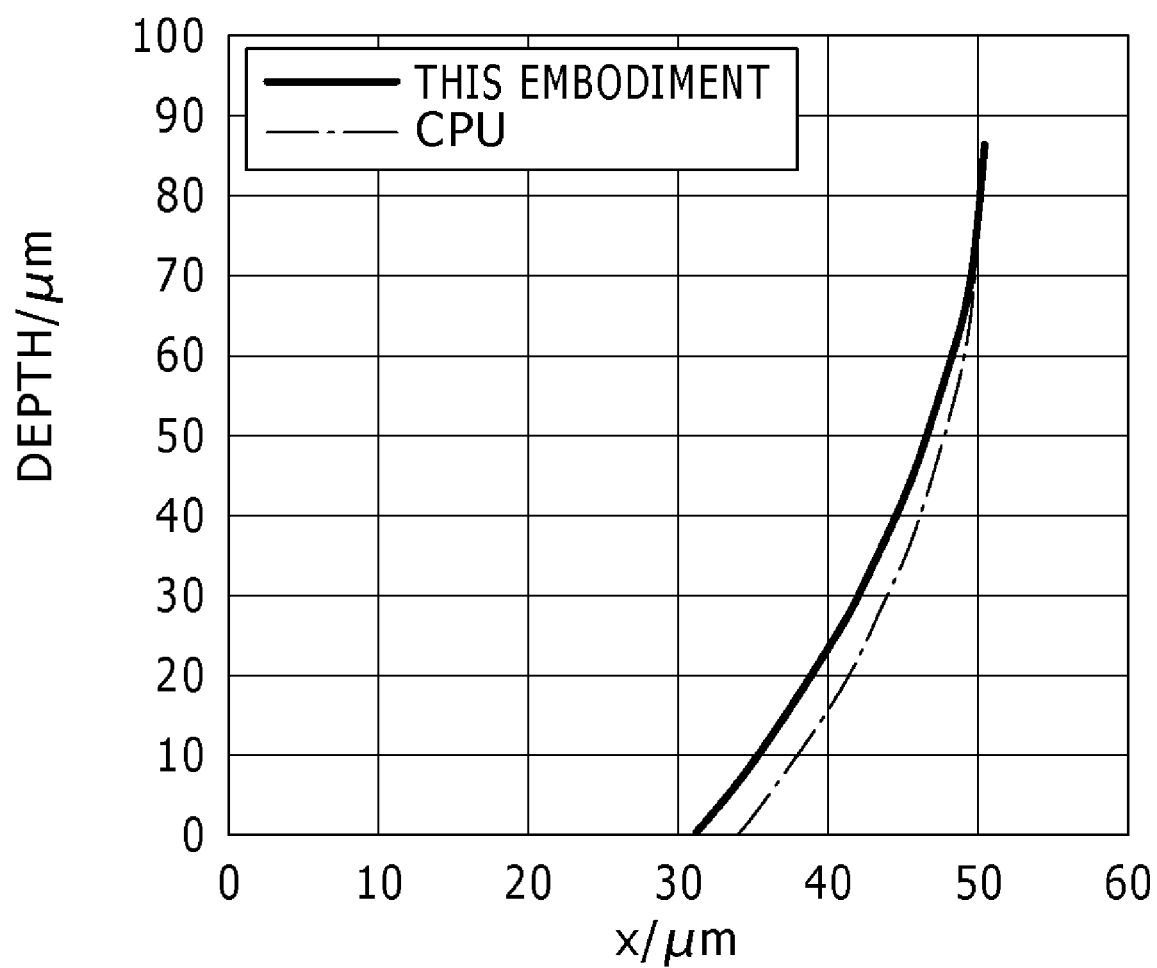

UV RADIATION (CURING)
FIG.13C PEELING 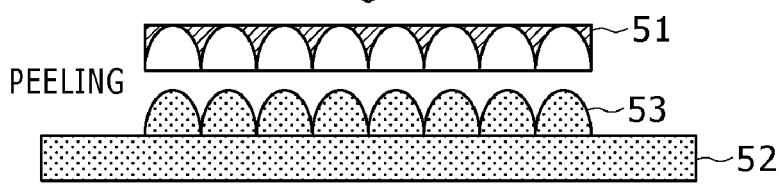

MIRROR EVAPORATION
FIG.13E FORMATION OF OPENING PORTION BY LAPPING 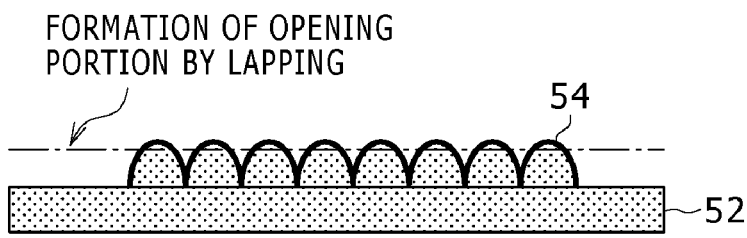

LIGHT EMITTING DEVICE, DISPLAY DEVICE AND A METHOD OF MANUFACTURING DISPLAY DEVICE

CROSS REFERENCES TO RELATED APPLICATIONS

The present invention contains subject matter related to Japanese Patent Application JP 2007-056598 filed in the Japanese Patent Office on Mar. 7, 2007, the entire contents of which being incorporated herein by reference.

BACKGROUND OF THE INVENTION

1. Field of the Invention

The present invention relates to a light emitting device, a display device and a method of manufacturing the display device.

2. Description of the Related Art

In recent years, light emitting devices (hereinafter referred to as "LEDs" for short), and organic light emitting diodes (hereinafter referred to as "OLEDs" for short) have been in widespread use as light emitting elements. Also, the LEDs and the OLEDs are widely utilized in the various fields of a light emitting device constituting lighting equipment, a display device called a flat panel display, and the like.

In the case where the light emitting device, the display device or the like is constituted by the light emitting element such as the OLED or the LED, it is demanded that light extraction is efficiently carried out. The reason for this is because the low light extraction efficiency leads to that an amount of actual luminance in the light emitting element is not effectively utilized, which triggers a large loss in terms of power consumption or the like.

For this reason, it is proposed to enhance the light extraction efficiency by using a micro-prism, a micro-lens, a concave mirror or the like in the light emitting device, the display device or the like using the OLED, the LED or the like. The technical propose, for example, is disclosed in Japanese Patent Laid-open Nos. 2003-77648 and 2002-184567.

In addition, recently, an example is also reported in which a structure of a compound parabolic concentrator (hereinafter referred to as "a CPC" for short) used as a concentrator for use in a solar cell is applied to a self light emitting device such as an organic EL element. This report, for example, is disclosed in Japanese Patent Laid-open No. 2005-531102.

Here, the CPC will be described in brief.

The CPC is devised for the purpose of efficiently guiding a light to a solar cell. The feature of the CPC is that a light reflected by a reflecting surface is necessarily directed toward a surface of a solar cell. Also, the CPC, as shown as its name, is a compound concave mirror using a part of a parabolic surface.

For details, as shown in FIG. 14A, a parabolic surface has a property that incident parallel rays of light are collected at one point (focal point). Here, it is considered the case that a lamination state of a layer made of a translucent material having a refractive index of N and an air layer contacting an interface between them as shown in FIG. 14B. When a symmetric axis of a parabolic surface formed on the translucent material layer is inclined at a critical angle having a view angle of $\theta = \sin^{-1}(1/N)$ between the layers, even if a light is made incident at a high angle near 90° from the side of the air layer, as shown in FIG. 14C, the light concerned necessarily passes through a line segment joining a focal point F of the parabolic surface and a point A on the parabolic surface. By utilizing these properties, a rotationally-symmetric body which is obtained such that a part of the parabolic surface is rotated with a central axis being set up at a middle point of a line segment FA as shown in FIG. 14D is a shape called the CPC. Thus, placing a solar cell on a surface containing the line segment FA allows the effective utilization of the light.

When such a structure of the CPC is applied with the surface of the solar cell as an emission surface, a very efficient reflecting mirror is obtained because a light emitted from the emission surface is necessarily extracted to the outside.

SUMMARY OF THE INVENTION

Now, when the reflecting mirror having the CPC structure is applied to the light emitting element such as the OLED or the LED, for example, as shown in FIG. 15, the light emitted from the light emitting element concerned is uniformly distributed over a high angle region (for example, over a region of a view angle of 63° or more) because the CPC has the feature of corresponding to an incident angle of 90° in the air.

However, when, for example, a use application as the display device is envisaged, such a case that its screen is visually observed at a high angle having a view angle of 70° or more is rare. Therefore, even when the characteristics of light distribution to the high angle region is enhanced more than needs, it is not said that so large merit is obtained from a viewpoint as well of realization or the like of low power consumption promotion. That is to say, further enhancing the luminance in the range of an effective visual sense than in the region of the high angle is desirable in terms of effective utilization of the emitted light from the light emitting element.

In the light of the foregoing, it is therefore desirable to provide a light emitting device having a reflecting mirror shape with which luminance within the range of an effective visual sense is remarkably enhanced by controlling a light distribution angle, distribution, etc. while uniformness of light distribution characteristics is maintained, thereby allowing high luminance promotion, low power consumption promotion, and the like, a display device, and a method of manufacturing the display device.

In order to attain the desire described above, according to an embodiment of the present invention, there is provided a light emitting device, including: a light emitting element configured to emit a light; and a concave mirror portion configured to reflect the light emitted from the light emitting element, the concave mirror portion being erected on a circumference of an emission surface of the light emitting element; in which the concave mirror portion has a light reflecting surface obtained by rotating a part of a parabola; and a central axis of the rotation is set in a position of passing through a side of the parabola with respect to a middle point of a line segment joining the part of the parabola and a focal point of the parabola.

In addition, according to another embodiment of the present invention, there is provided a display device, including: a plurality of light emitting elements configured to emit lights, respectively, the plurality of light emitting elements being arranged in accordance with a predetermined rule; and concave mirror portions configured to reflect the lights emitted from the plurality of light emitting elements, respectively, the concave mirror portions being erected on circumferences of emission surfaces of the plurality of light emitting elements so as to correspond to the plurality of light emitting elements, respectively; in which each of the concave mirror portions has a light reflecting surface obtained by rotating a part of a parabola; and a central axis of the rotation is set in a position of passing through a side of the parabola with respect to a middle point of a line segment joining the part of the parabola and a focal point of the parabola.

Also, according to still another embodiment of the present invention, there is provided a method of manufacturing a display device including: a plurality of light emitting elements configured to emit lights, respectively, the plurality of light emitting elements being arranged in accordance with a predetermined rule; and concave mirror portions configured to reflect the lights emitted from the plurality of light emitting elements, respectively, the concave mirror portions being erected on circumferences of emission surfaces of the plurality of light emitting elements so as to correspond to the plurality of light emitting elements, respectively, the method including the steps of: forming a light reflecting surface of each of the concave mirror portions to have a shape obtained by rotating a part of a parabola; and setting a central axis of the rotation in a position of passing through a side of the parabola with respect to a middle point of a line segment joining the part of the parabola and a focal point of the parabola.

In the light emitting device and the display device which are constituted in the manner as described above, and a method of manufacturing the same which is constituted to have the procedure as described above, the central axis of the rotation of the parabola constituting the light reflecting surface of the concave mirror portion is set in the position of passing through the side of the parabola with respect to the middle point of the line segment joining the part of the parabola and the focal point of the parabola. Here, a light passing through the vicinity of the focal point of the parabola corresponding to a light distribution component in the high angle region when being emitted after reflection by the light reflecting surface of the concave mirror portion. Therefore, when the central axis of the rotation of the parabola is set in the position of passing through the side of the parabola, the light component passing through the vicinity of the focal point of the parabola, that is, the light distribution component in the high angle region is suppressed by an amount of approach to the side of the parabola. As a result, the light distribution component on the low angle side relatively increases.

According to the embodiments of the present invention, the light distribution component in the high angle region is suppressed by the amount of approach of the central axis of the rotation of the parabola to the side of the parabola, thereby making it possible to relatively increase the light distribution component on the side of the low angle region. This fact means that the light distribution angle, distribution, etc. can be controlled depending on the set position of the central axis of the rotation of the parabola. Therefore, according to the embodiments of the present invention, the light distribution angle, distribution, etc. are controlled while the uniformness of the light distribution characteristics is maintained, thereby making it possible to more greatly enhance the luminance within the range of the effective visual sense than that in related art one. That is to say, the bright lighting, image display, etc. can be realized with the low power consumption through the improvement in the luminance view angle characteristics due to the uniformness of the light distribution of the reflected light.

BRIEF DESCRIPTION OF THE DRAWINGS

FIG. 11 is a graph showing a concrete example of the shape of the light reflecting surface of the concave mirror portion in the organic EL display to which the present invention is applied in comparison with the case of a CPC;

FIG. 12 is a diagram showing an example in which an energy for light extraction, an improvement in luminance in a front surface, and a luminance view angle in the organic EL display to which the present invention is applied are compared with those existing structure and the like;

FIGS. 13A to 13F are respectively cross sectional views explaining a procedure for manufacturing the organic EL display to which the present invention is applied by utilizing a photo-polymer (2P) duplication method;

DETAILED DESCRIPTION OF THE PREFERRED EMBODIMENTS

Hereinafter, preferred embodiments of a light emitting device, a display device and a method of manufacturing the same according to the present invention will be described in detail with reference to the accompanying drawings.

[Schematic Structure of Display Device]

Firstly, a schematic structure of the display device will now be described. In this case, a description will be given below by giving an active matrix display device using an organic EL element as a light emitting element (hereinafter referred to as "an organic EL display") as an example.

Figure 1:
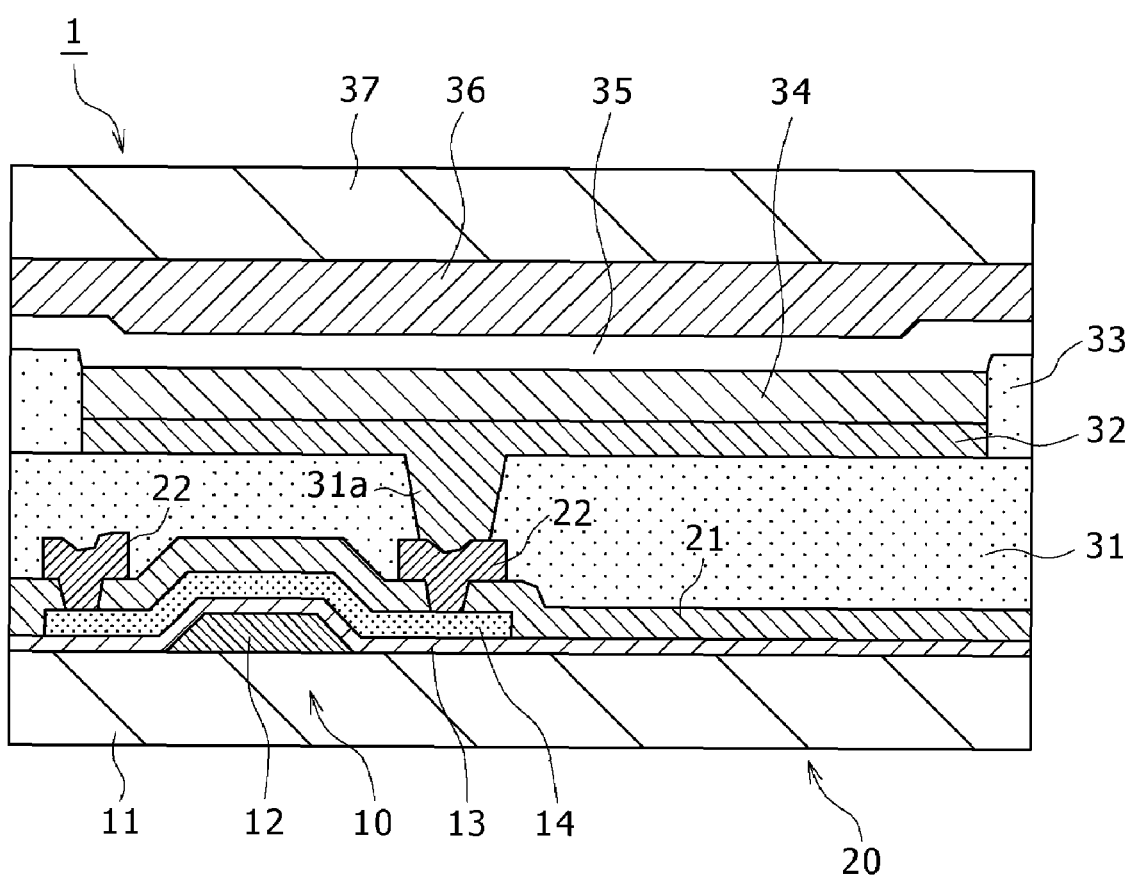
FIG. 1 is an explanatory cross sectional view showing a schematic structural example of an organic EL display.

FIG. 1 is an explanatory cross sectional view showing a schematic structural example of the organic EL display.

The organic EL display 1 having a structure shown in the figure is manufactured in accordance with a procedure as will be described below.

Firstly, after a gate film 12, for example, made from a molybdenum (Mo) film is formed through patterning on a substrate 11 made from a glass substrate, the entire surface of the resulting substrate 11 is covered with a gate insulating film 13, for example, made from an SiO/SiN film. Also, a semiconductor layer 14 made from an a-Si film is deposited over the gate insulating film 13. A laser annealing treatment is carried out for the semiconductor layer 14, so that the semiconductor layer 14 turns from the a-Si film into a p-Si film through crystallization. Next, the resulting semiconductor layer 14 is patterned to have an island shape so as to cover the gate film 12. After that, an insulating pattern (not shown) is formed in a position of the semiconductor later 14 located above the gate film 12 by performing back-side exposure from the substrate 11 side. Thereafter, ion implantation and an activation annealing treatment are carried out with the insulating pattern as a mask, thereby forming a source/drain region in the semiconductor layer 14. Though the processes described above, a thin film transistor (hereinafter referred to as "a TFT") 10 is formed on the substrate 11. Although the TFT formed by utilizing the p-Si technique has been described so far as an example, it is no problem to form a TFT by utilizing an a-Si technique or any other suitable crystallization technique.

After that time, the TFT 10 is covered with an interlayer insulating film 21. Also, a wiring 22 is wired so as to be connected to the TFT 10 through a contact hole formed in the interlayer insulating film 21, thereby forming a pixel circuit. Through the processes described above, a so-called TFT substrate 20 is formed.

After completion of the formation of the TFT substrate 20, the TFT substrate 20 is covered with a planarizing insulating film 31, a contact hole 31a is formed in the planarizing insulating film 31 so as to reach the wiring 22. Also, a pixel electrode 32, for example, is formed as an anode on the planarizing insulating film 31 so as to be connected to the wiring 22 through the through hole 31a. It is envisaged that the pixel electrode 32 is made from an aluminum (Al) system/ silver (Ag) system high reflecting metallic film by, for example, utilizing a photolithography process.

Also, the circumference of the pixel electrode 32 is covered with an insulating film pattern 33. An organic EL material layer 34 is laminated and deposited so as to cover an exposed surface of the pixel electrode 32. Also, a counter electrode 35 is formed with an insulating property being held for the pixel electrode 32. The counter electrode 35, for example, is made as a cathode from a conductive transparent film, for example, made of an indium tin oxide (ITO) or an indium zinc oxide (IXO), and is also formed in the form of a solid film common to all the pixels. In such a manner, an organic EL element is structured in which the organic EL material layer 34 such as an organic hole transportation layer or an organic light emitting layer is disposed between the pixel electrode 32 as the anode and the counter electrode 35 as the cathode. Note that, although a top emission type organic EL display is given as an example in this case, when a bottom emission type organic EL display is structured, the pixel electrode 32 needs to be made from a conductive transparent film, and the counter electrode 35 needs to be made from a high reflection metallic film. In addition, it is also possible to adopt a micro-cavity structure in which a light is resonated by using a half mirror either in the counter electrode 35 or in the pixel electrode 32.

After that, a transparent substrate 37 is stuck to the counter electrode 35 through an adhesive layer 36 having a translucency, thereby completing the organic EL display 1. Note that, the details of the adhesive layer 36 and the transparent substrate 37 will be described later.

Figure 2A:
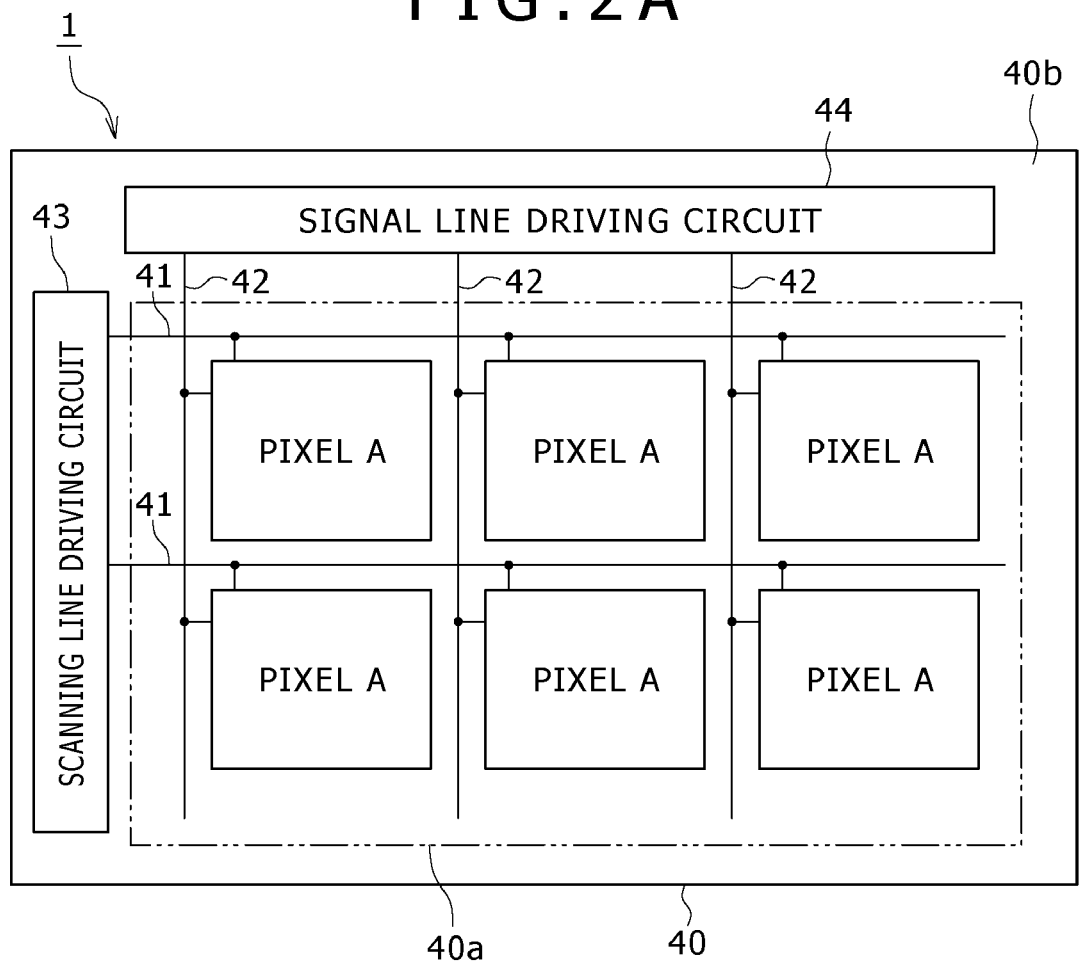
FIGS. 2A and 2B are respectively explanatory views showing an example of a structure of a pixel circuit of the organic EL display.
Figure 2B:
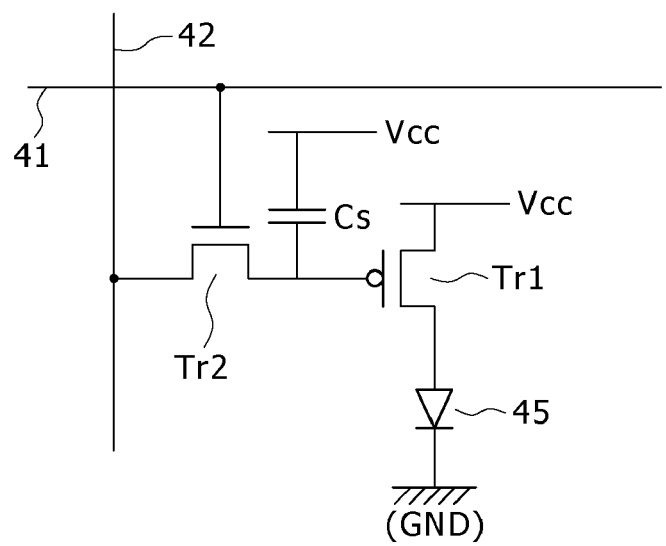

FIGS. 2A and 2B are explanatory views showing an example of a structure of the pixel circuit of the organic EL display.

As shown in FIG. 2A, a display region 40a and a peripheral region 40b thereof are set on a substrate 40 of the organic EL display 1. The display region 40a is structured in the form of a pixel array portion in which a plurality of scanning lines 41 and a plurality of signal lines 42 are wired horizontally and vertically, respectively, and pixels A are provided so as to correspond to intersection portions between the plurality of scanning lines 41 and the plurality of signal lines 42, respectively. The organic EL element is provided in each of the pixels A. In addition, a scanning line driving circuit 43 and a signal line driving circuit 44 are disposed in the peripheral region 40b. Here, the scanning line driving circuit 43 successively scans and drives the scanning lines 41. The signal line driving circuit 44 successively supplies a video signal (that is, an input signal) corresponding to luminance information to the signal lines 42.

Also, it is assumed that in order to carry out image display corresponding to full color, the organic EL elements corresponding to color components of R, G and B are mixedly provided in the display region 40a and are disposed in matrix pattern in accordance with a predetermined rule. It is possible to equalize the number of organic EL elements installed, and formation areas thereof among the color components of R, G and B. However, for example, it is no problem that the number of organic EL elements installed, and the formation areas thereof are made different among the color components of R, G and B in correspondence to energy components by the color components of R, G and B.

In addition, as shown in FIG. 2B, the pixel circuit provided in each of the pixels A, for example, is composed of an organic EL element 45, a driving transistor Tr1, a writing transistor (sampling transistor) Tr2, and a holding capacitor Cs. Also, the video signal is written and held from the signal line 42 through the writing transistor Tr2 in the holding capacitor Cs by the driving made by the scanning line driving circuit 43. A current corresponding to an amount of signal held is supplied to the organic EL element 45. Also, the organic EL element 45 emits a light at luminance corresponding to a value of the current.

It is noted that the structure of the pixel circuit as described above is merely an example, and thus a capacitor may be provided in the pixel circuit and moreover a plurality of transistors may be provided to structure the pixel circuit as may be necessary. In addition, in this case, a necessary driving circuit is added to the peripheral region 40b in corresponding to a change of the pixel circuit.

Figure 3:
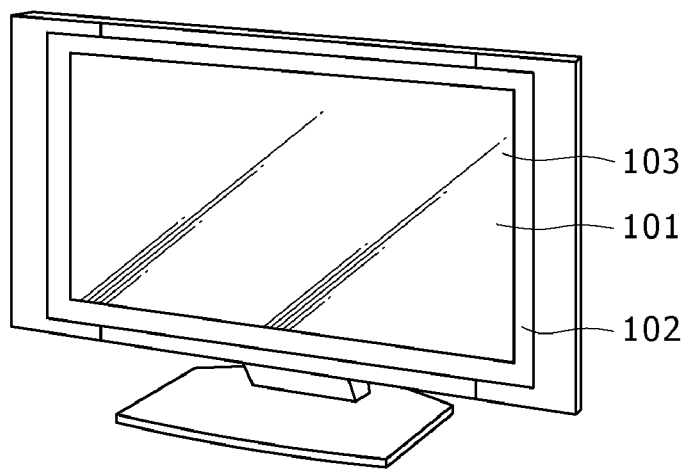
FIG. 3 is a perspective view showing a television set as a concrete example of an electronic apparatus having a display device.

FIG. 3 is a perspective view showing a television set as a concrete example of an electronic apparatus having the display device of this embodiment. The television set shown in the figure includes an image display screen portion 101 composed of a front panel 102, a filter glass 103, and the like. Also, the television set is manufactured by using the organic EL display 1 as the image display screen portion 101.

Figure 4A:
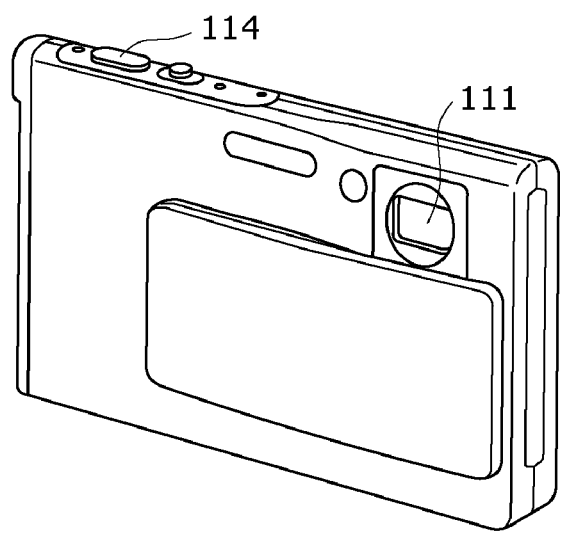
FIGS. 4A and 4B are respectively perspective views showing a digital camera as a concrete example of the electronic apparatus having the display device.
Figure 4B:
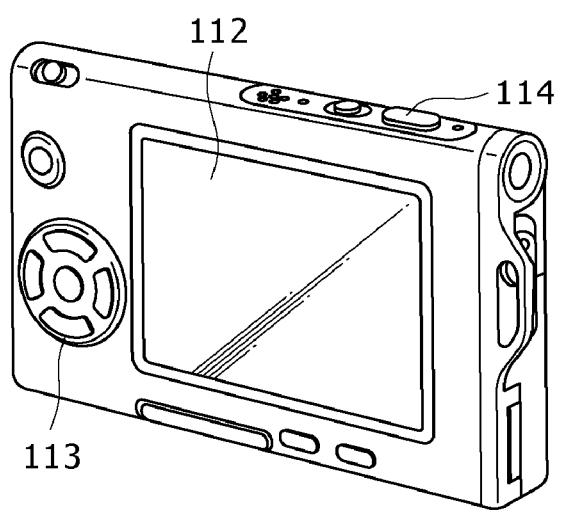

FIGS. 4A and 4B are respectively perspective views showing a digital camera as a concrete example of the electronic apparatus having the display device of this embodiment. Here, FIG. 4A is a perspective view when the digital camera is viewed from a front side, and FIG. 4B is a perspective view when the digital camera is viewed from a back side. The digital camera shown in the figures includes a light emitting portion 111 for flash, a display portion 112, a menu switch 113, a shutter button 114, and the like. Also, the digital camera is manufactured by using the organic EL display 1 as the display portion 112.

Figure 5:
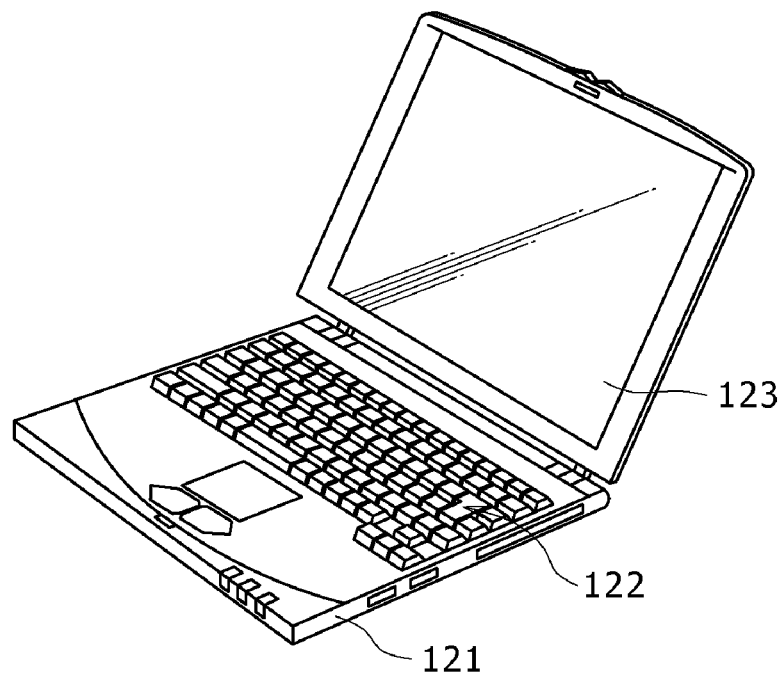
FIG. 5 is a perspective view showing a notebook type personal computer as a concrete example of the electronic apparatus having the display device.

FIG. 5 is a perspective view showing a notebook-type personal computer as a concrete example of the electronic apparatus having the display device of this embodiment. The notebook-type personal computer shown in the figure includes a main body 121, a keyboard 122 which is manipulated when characters or the like are inputted, a display portion 123 which displays thereon an image, and the like. Also, the notebook-sized personal computer is manufactured by using the organic EL display 1 as the display portion 123.

Figure 6:
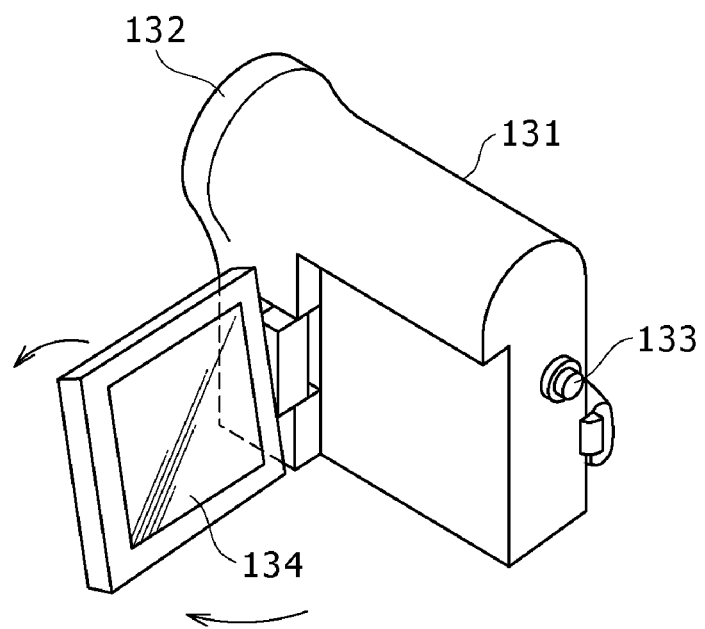
FIG. 6 is a perspective view showing a video camera as a concrete example of the electronic apparatus having the display device.

FIG. 6 is a perspective view showing a video camera as a concrete example of the electronic apparatus having the display device of this embodiment. The video camera shown in the figure includes a main body portion 131, a lens 132, for photographing a subject, which is provided on a side surface turned forward, a start/stop switch 133 which is manipulated in photographing a subject, a display portion 134, and the like. Also, the video camera is manufactured by using the organic EL display 1 as the display portion 134.

Figures 7A, 7B:
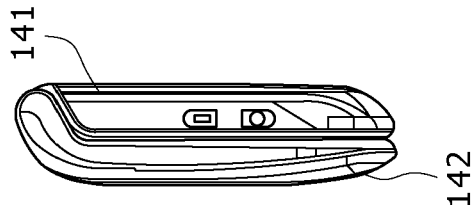
FIGS. 7A to 7G are respectively views showing a mobile terminal, for example, a mobile phone as a concrete example of the electronic apparatus having the display device.
Figure 7D:
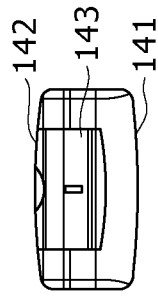
Figures 7C, 7F:
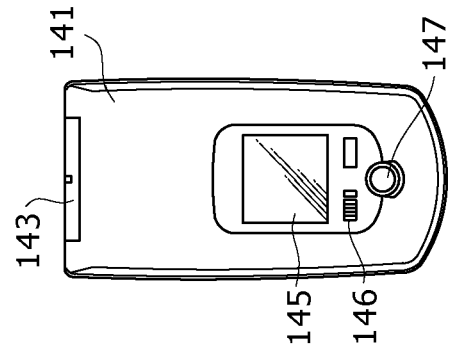
Figure 7G:
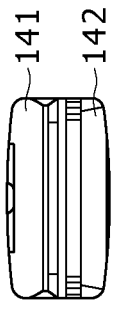
Figure 7E:
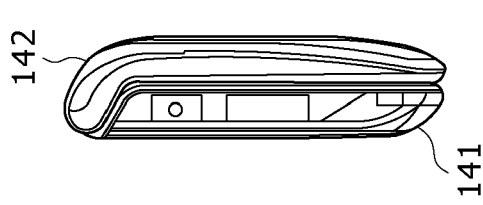

FIGS. 7A to 7G are respectively views showing a mobile terminal, for example, a mobile phone as a concrete example of the electronic apparatus having the display device of this embodiment. Here, FIG. 7A is a front view in a state in which the mobile phone is opened, FIG. 7B is a side elevational view of the mobile phone, FIG. 7C is a front view in a state in which the mobile phone is closed, FIG. 7D is a left-hand side elevational view of the mobile phone, FIG. 7E is a right-hand side elevational view of the mobile phone, FIG. 7F is a top plan view of the mobile phone, and FIG. 7G is a bottom view of the mobile phone. The mobile phone of this application example includes an upper chassis 141, a lower chassis 142, a connection portion (a hinge portion in this case) 143, a display 144, a sub-display 145, a picture light 146, a camera 147, and the like. Also, the mobile phone is manufactured by using the organic EL display 1 as each of the display 144 and the sub-display 145.

[Characteristic Structure of Display Device]

Next, a characteristic structure of the organic EL display 1 in this embodiment will be described in detail.

Figure 8:
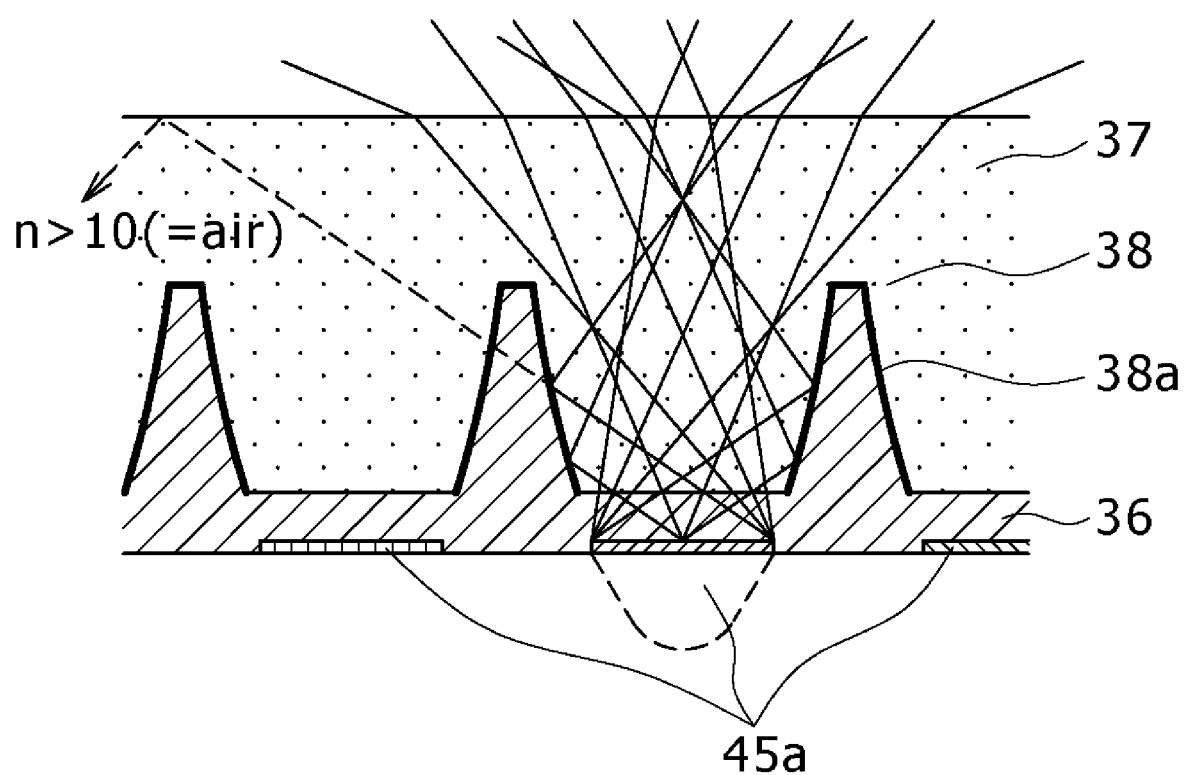
FIG. 8 is an explanatory view showing a structural example of a main portion of an organic EL display to which the present invention is applied.

FIG. 8 is an explanatory view showing a structural example of a main portion of the organic EL display to which the present invention is applied.

As shown in the figure, in the organic EL display 1 in this embodiment, the entire surface of an emission surface 45a side of each of the organic EL elements 45 which are disposed in accordance with the predetermined rule is covered with an adhesive layer 36 and a transparent substrate 37. Each of the adhesive layer 36 and the transparent substrate 37 has the translucency.

Moreover, the transparent substrate 37 is cast to have an irregular shape so as to correspond to the emission surface 45a. A light reflecting surface 38a made either from a metallic reflecting layer, having a high light reflectivity, made of aluminum (Al) or silver (Ag), or from a multi-layer thin film including the metallic reflecting layer is formed in a part of an irregular-shaped interface between the adhesive layer 36 and the transparent substrate 37.

That is to say, in the organic EL display 1 in this embodiment, a concave mirror portion 38 in which the light reflecting surface 38a is structured either by the metallic reflecting layer or by the multi-layer thin film is erected on the circumference of each of the emission surfaces 45a of this organic EL element 45 so as to protrude along the light emission direction. Also, both the emission surfaces 45a of the organic EL elements 45, and the light reflecting surfaces of the concave mirror portions 38 are covered with the transparent substrate 37 having the translucency. Thus, after being reflected by the light reflecting surfaces 38a of the concave mirror portions 38 as may be necessary, the lights from the emission surfaces 45a of the organic EL elements 45 are emitted from the surface of the transparent substrate 37 toward a side of an air layer contacting the surface of the transparent substrate 37.

Figure 9A:
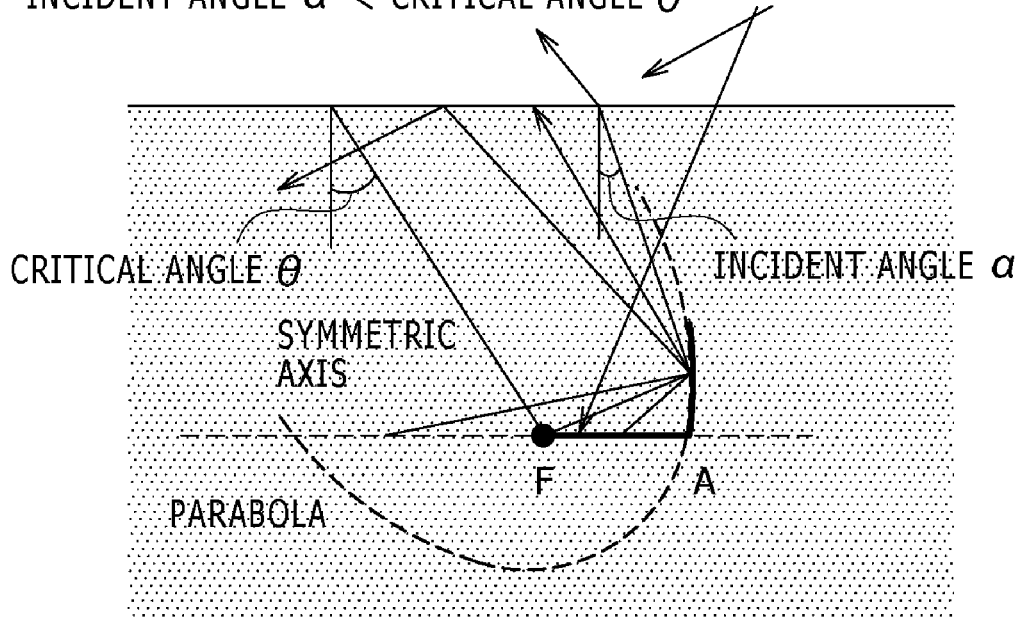
FIGS. 9A and 9B are respectively explanatory views showing a concrete example of a shape of a light reflecting surface of a concave mirror portion in the organic EL display to which the present invention is applied.
Figure 9B:
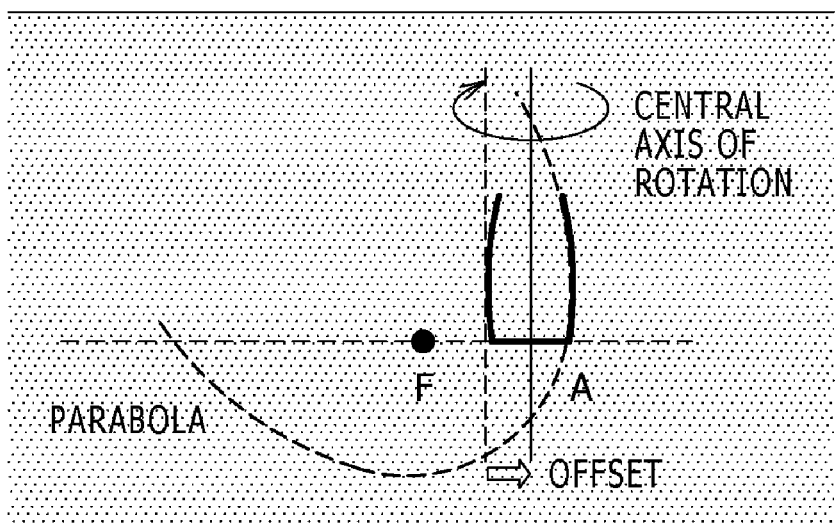

FIGS. 9A and 9B are respectively explanatory views showing a concrete example of a shape of a light reflecting surface of the concave mirror portion in the organic EL display to which the present invention is applied.

The light reflecting surface 38a of the concave mirror portion 38 is formed to have a shape which is obtained by rotating a part of a parabola similarly to the case of the CPC. However, a central axis of the rotation is different from a symmetric axis of the parabola.

For more details, as shown in FIG. 9A, the symmetric axis of the parabola inclines so as to correspond to a critical angle. Here, the critical angle is specified by both the transparent substrate 37 on which the light reflecting surfaces each having the shape based on the parabola concerned are formed, and the air layer contacting the surface (interface) of the transparent substrate 37. In the case of the CPC, the angle of inclination of the symmetric axis of the parabola is made to agree with the critical angle depending on a difference in refractive index between the translucent material layer and the air layer. However, in the case of the organic EL display 1 in this embodiment, it is unnecessary to distribute many lights to the high angle side. In addition thereto, there are some lights which are directly distributed to the high angle side without being reflected by the corresponding ones of the light reflecting surfaces 38a of the concave mirror portions 38. For this reason, the angle of inclination of the symmetric axis of the parabola needs not to be necessarily made to agree with the critical angle, and thus is practical as long as it is equal to or smaller than the critical angle. That is to say, the inclination corresponding to the critical angle stated herein means inclination owing to an angle equal to or smaller than the critical angle concerned. In this regard, with respect to this inclination as well, the light distribution having the angle equal to or larger than the inclination angle does not exist in the reflected light at all. Hence, shallowing the angle so as to become near the limit results in that a step appears in the luminance light distribution. For this reason, since it is impossible to set the angle in the air as being equal to or smaller than 70°, actually, about 10° is thought to be a limit angle.

Here, a description will be given with respect to an arrangement about a focal point of a parabola a symmetric axis of which is inclined, and a central axis of the rotation of the parabola with which the light reflecting surface 38a of the concave mirror portion 38 is formed through the rotation.

In the case of the CPC, a symmetric axis of rotation is set at a middle point of a line segment joining a focal point of a parabola and a point on the parabola concerned. For this reason, the focal point is necessarily located across the symmetric axis of the rotation from the light reflecting surface. In such a state, as described in the paragraph of "Description of Related Art" (refer to FIGS. 14A to 14D), the uniform light distribution characteristics are obtained, which results in that although being practically impossible in terms of the visual sense direction, the light is also distributed to the high angle side.

This fact means that if the light in that direction (in the direction on the high angle side for which the light distribution is practically impossible) can be distributed to the low angle side, the front side luminance can be enhanced along therewith.

Thus, in the case of the organic EL display 1 in this embodiment, as shown in FIG. 9B, a central axis of rotation of a parabola with which a light reflecting surface is formed through the rotation is set in a position of passing through the side of the parabola with respect to a middle point of a line segment FA joining the focal point F of the parabola and a point A on the parabola. That is to say, the position of the central axis of the rotation of the parabola is offset-disposed so as to approach the side of the parabola.

When, for example, the axis of the parabola inclines in the direction of the critical angle, the light passing through the vicinity of the focal point F of the parabola corresponds to a light component which is distributed at a light distribution angle (that is, at the high angle) near the critical angle.

Therefore, the offset setting of the central axis of the rotation of the parabola in the position of passing through the side of the parabola concerned results in that the light component passing through the vicinity of the focal point of the parabola concerned, that is, the light distribution component in the high angle region is suppressed by an amount of offset with which the central axis of the rotation of the parabola approaches the side of the parabola concerned, so that the light component in the low angle region relatively increases.

Figure 10A:
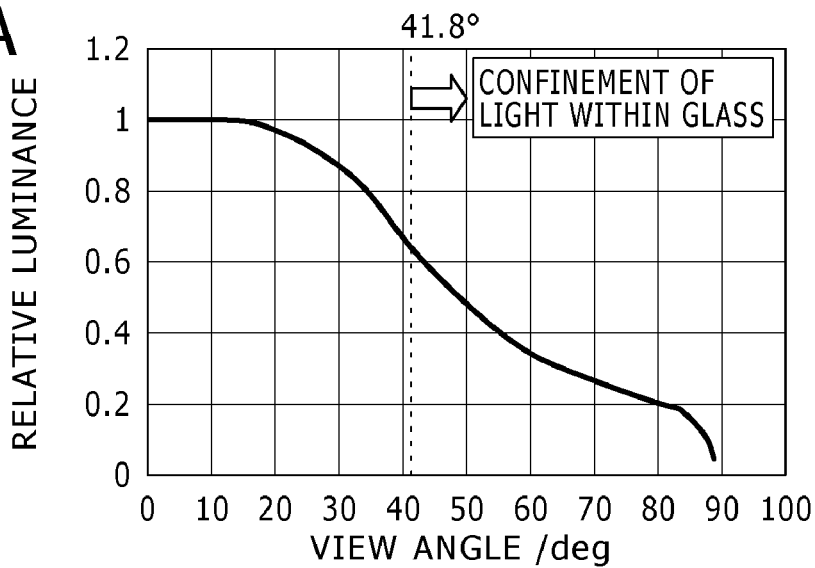
FIGS. 10A to 10C are respectively graphs showing concrete examples of suppression of a light distribution component in a high angle region in the organic EL display to which the present invention is applied.
Figure 10B:
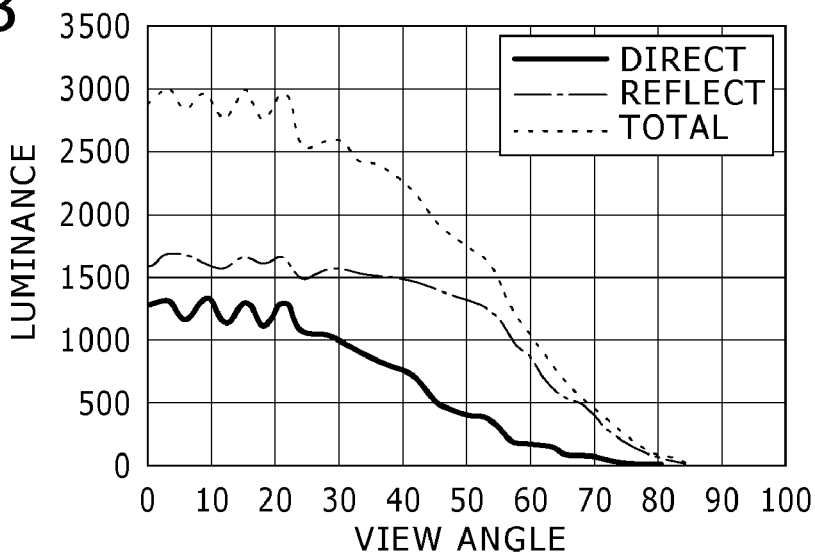
Figure 10C:
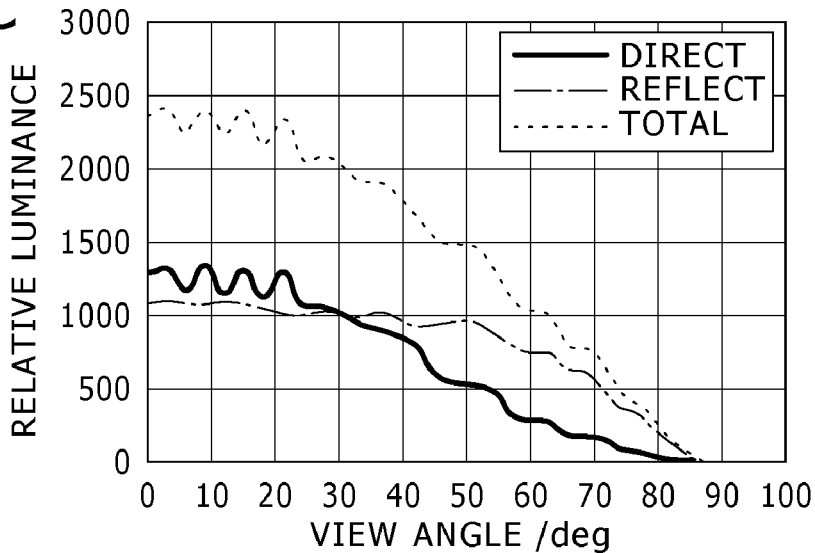

FIGS. 10A to 10C are respectively graphs showing concrete examples of the suppression of the light distribution component in the high angle region in the organic EL display to which the present invention is applied.

For example, let us make a consideration by giving the light distribution characteristics in the transparent substrate 37, made of a glass material (having a refractive index of 1.5), of the organic EL element 45 having a resonance structure as an example. The refractive index of 1.5 results in that its critical angle is 41.8° in the transparent substrate 37. This leads to that any of the lights each having a reflection angle larger than 41.8°, as shown in FIG. 10A, is confined within the transparent substrate 37 by the total reflection thereof.

When the concave mirror portion 38 having the light reflecting surface 38a obtained by offset-disposing the central axis of the rotation of the parabola, as described above, is disposed in the organic EL element 45 having such a light emitting portion, the luminance view angle characteristics of the reflected light in a state of including the concave mirror portion 38, the direct light without through the concave mirror portion 38, and the total of the reflected light and the direct light are as shown in characteristic curves of FIG. 10B, respectively. The concave mirror portion 38 as the base of the luminance view angle characteristics shown in FIG. 10B has a shape which is optimized when an opening portion is set in the range of 60 to 70 μm in diameter with a pixel pitch having 100 μm square. Also, the parabola having a focal length of f=70 μm is inclined to the critical angle, and an amount of offset of the symmetric axis of the rotation is set at 11.5 μm.

According to the luminance view angle characteristics shown in FIG. 10B, that is, the luminance view angle characteristics obtained based on the concave mirror portion 38 having the optimized shape described above, the luminance shows the flat characteristics up to the vicinity of the view angle of 50° (<63°) and then gently decreases up to the view angle of 90° similarly to the case of the CPC shown in FIG. 10C. However, it is understood from FIG. 10B that the luminance in the front side direction is improved as compared with the case of the CPC because the luminance in the flat portion of the luminance view angle characteristics is higher than that in the case of the CPC.

FIG. 11 is a graph showing a concrete example of a shape of the light reflecting surface of the concave mirror portion in the organic EL display to which the present invention is applied in comparison with the case of the CPC. The example shown in FIG. 11 shows the light reflecting surface shape of the concave mirror portion 38 obtained under predetermined conditions in this embodiment, and the light reflecting surface shape of the CPC optimized under the same conditions in comparison with each other. According to this example, the light reflecting surface shape of the concave mirror portion 38 has a narrowed shape such that the opening portion becomes narrow as the element light emitting surface is further approached as compared with the case of the shape of the light reflecting surface 38a of the CPC. That is to say, the offsetting of the position of the central axis of the rotation of the parabola with which the light reflecting surface of the concave mirror portion 38 is formed through the rotation results in that a difference as shown in the figure occurs in the shape of the light reflecting surface as compared with the case of the CPC in which no position of the central axis of the rotation is offset.

Figure 12:
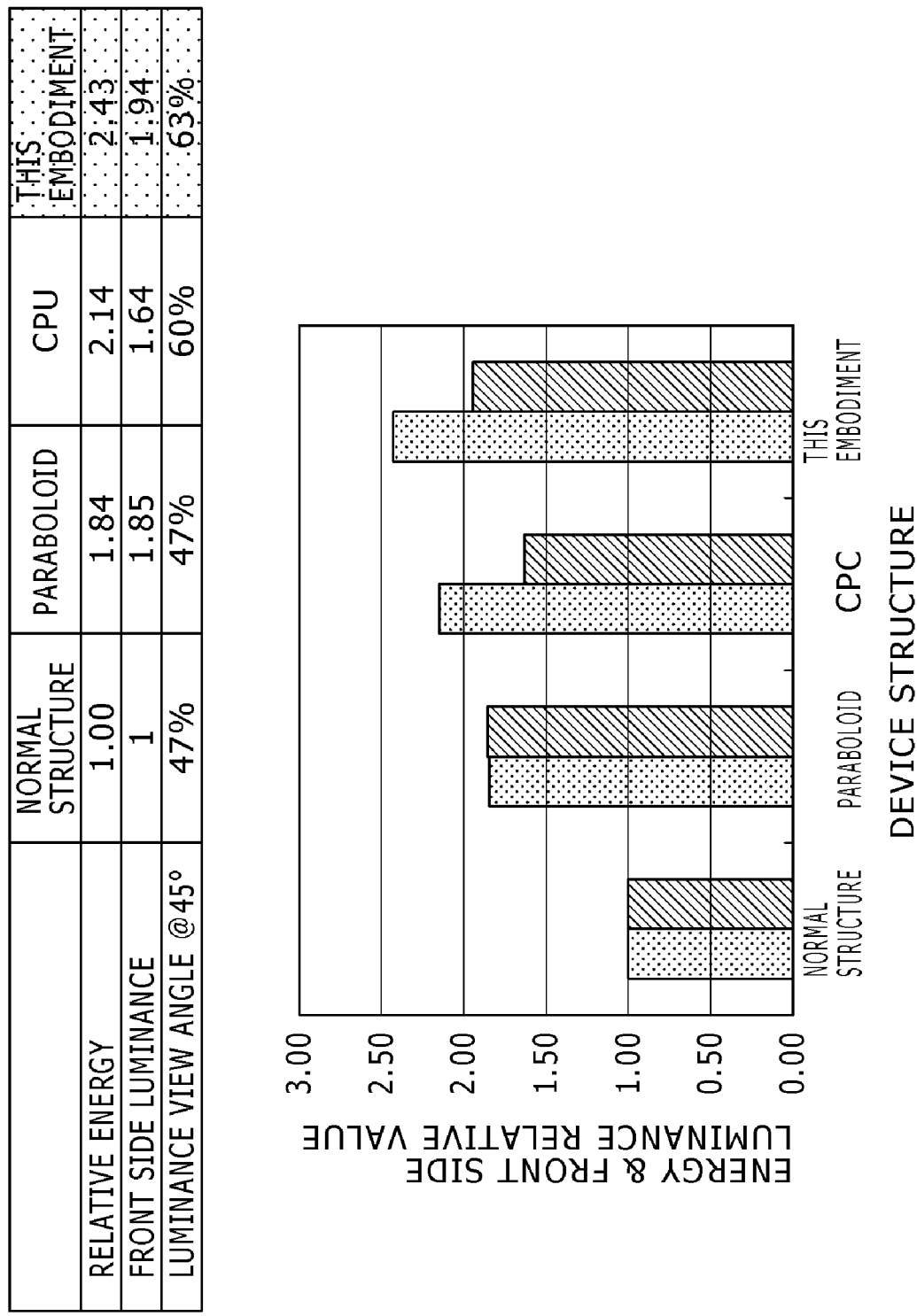

FIG. 12 is an exemplary diagram showing an example in which an energy for light extraction, an improvement in luminance in a front surface, and a luminance view angle in the organic EL display to which the present invention is applied are compared with those in a related art structure and the like. That is to say, in this example, the results obtained from the shape of the light reflecting surface 38a of the concave mirror portion 38 obtained under the predetermined conditions in this embodiment, the shape of the light reflecting surface 38a of the CPC optimized under the same conditions, a shape of a light reflecting surface constituted by a simple parabolic surface, the existing structure having no concave mirror portion are shown in FIG. 12 in comparison with one another with respect to the items of the energy for light extraction, the rate of the improvement in the front side luminance, and the luminance view angle. It is understood from the results shown in FIG. 12 that when the shape of the light reflecting surface 38a of the concave mirror portion 38 in this embodiment is used, the largest energy is extracted therefrom. In addition, according to the shape of the light reflecting surface 38a of the concave mirror portion 38 in this embodiment, there is the room in terms of the extracted energy, and the front side luminance, and the luminance view angle of 45° can also be improved as compared with any of other structures.

As has been described so far, in the organic EL display 1 in this embodiment, the central axis of the rotation of the parabola with which the light reflecting surface 38a of the concave mirror portion 38 is formed through the rotation is set in the position of passing through the side of the parabola concerned with respect to the middle point of the line segment FA joining the focal point F of the parabola concerned and the point A on the parabola. As a result, the light component passing through the vicinity of the focal point F of the parabola concerned, that is, the light distribution component in the high angle region is suppressed by the degree that the central axis of the rotation of the parabola approaches the side of the parabola concerned, so that the light component in the low angle region relatively increases. This fact means that the control for the light distribution angle, distribution, etc. becomes possible by the offset of the set position of the central axis of the rotation of the parabola. Therefore, in the organic EL display 1 in this embodiment, the control for the light distribution angle, distribution, etc. is carried out while the uniformness of the light distribution characteristics is maintained, thereby making it possible to more greatly enhance the luminance within the effective visual sense range than that in existing one. That is to say, the bright image display can be realized with the low power consumption by the improvement in the luminance view angle characteristics owing to the uniformness of the light distribution of the reflected light.

In addition, in the organic EL display 1 in this embodiment, both the emission surfaces 45a of the organic EL elements 45, and the light reflecting surfaces 38a of the concave mirror portions 38 are covered with the transparent substrate 37 having the translucency. Also, the symmetric axis of the parabola with which the light reflecting surface 38a is formed through the rotation is given the inclination corresponding to the critical angle in the interface on the light emission side of the transparent substrate 37, that is, the inclination having the angle equal to or smaller than the critical angle concerned. Therefore, the uniform light distribution is obtained over the high angle region similarly to the case of the CPC. As a result, the sufficient uniformness of the light distribution characteristics can be highly saved.

Now, when the inclination angle of the symmetric axis of the parabola is shallowed (when the inclination angle thereof is made small), it becomes possible to enhance the front side luminance. However, when the inclination angle of the symmetric axis of the parabola is shallowed to become near the critical angle, the step appears in the luminance light distribution. For this reason, the inclination angle of the symmetric axis of the parabola is preferably set at the angle which is equal to or smaller than the critical angle and which is of such a degree that no step appears in the luminance light distribution. That is to say, the enhancement of the front side luminance owing to the shallowing of the inclination angle of the symmetric axis of the parabola is merely an auxiliary part. Thus, the enhancement of the front side luminance concerned is mainly realized by the offset of the set position of the central axis of the rotation of the parabola.

It is noted that the amount of offset of the central axis of the rotation of the parabola may be set based on the desired light distribution of the emitted light from the light emission side of the transparent substrate 37 when the organic EL display 1 is structured. That is to say, if there is given a specification about the light distribution which the organic EL display 1 should fulfill (a desired specification regulating that a quantity of light of 90% or more at the view angle of 50° is maintained, and so forth), the amount of offset fulfilling this specification may be obtained by, for example, utilizing the known simulation technique.

[Method of Manufacturing Display Device]

Next, a procedure for manufacturing the organic EL display 1 having the structure as described above will be described in detail. In this case, the description will now be given by taking particular note of a procedure for manufacturing the concave mirror portion 38.

In manufacturing the organic EL display 1, firstly, the amount of offset of the central axis of the rotation of the parabola, that is, the shape of the light reflecting surface 38a of the concave mirror portion 38 is specified by, for example, utilizing the known simulation technique based on the specification which the organic EL display 1 should fulfill. After the shape of the light reflecting surface of the concave mirror portion 38 is specified, it is expected that the concave mirror portion 38 is formed by, for example, utilizing the photopolymer (2P) duplication method. However, the present invention is not necessarily limited to the 2P duplication method, and thus the concave mirror portion 38 may be formed by utilizing any other suitable known method.

FIGS. 13A to 13F are respectively cross sectional views explaining the procedure for manufacturing the organic EL display to which the present invention is applied by utilizing the 2P duplication method.

Figure 13A:
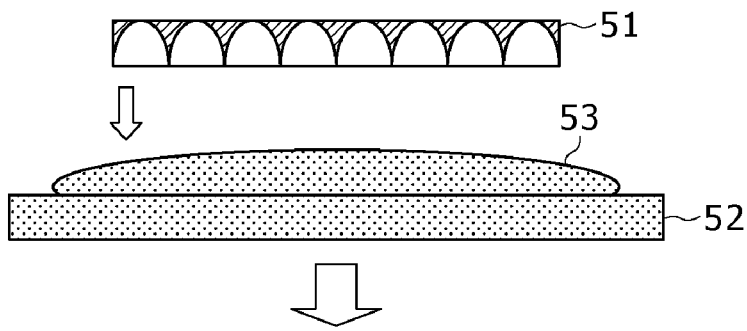
Figure 13B:
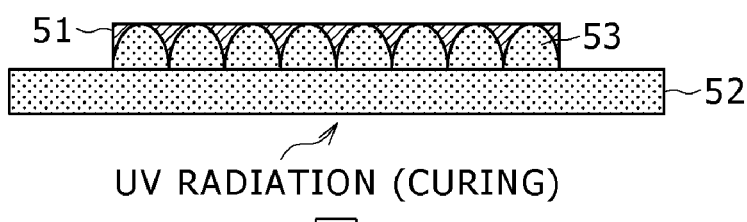

In the case of utilizing the 2P duplication method, firstly, as shown in FIG. 13A, a stamper (female die) 51 corresponding to the shape of the light reflecting surface 38a of the specified concave mirror portion 38 is formed by utilizing the known technique such as the electrocasting, the etching or other cutting work. Also, for example, a resin composition 53 having translucency is applied to a glass substrate 52 also having the translucency, and the resin composition 53 thus applied is cast by using the stamper 51 thus formed. That is to say, after completion of UV radiation (curing) to the resin composition 53 as shown in FIG. 13B, as shown in FIG. 13C, the resin composition 53 is cast to have the shape specified by the stamper 51 by peeling off the stamper 51.

Figure 13D:
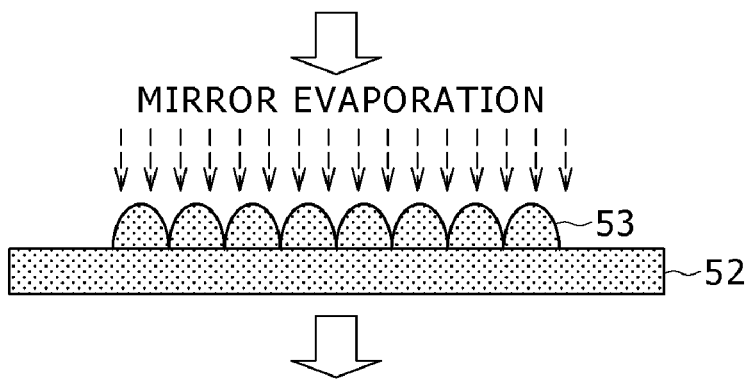

After completion of the casting of the resin composition 53, as shown in FIG. 13D, a metallic reflecting layer (or a multi-layer thin film containing the metallic reflecting layer) 54, having a high light reflectivity, made of Al, Ag or the like is formed over the entire surface of the resin composition 53 by, for example, utilizing the vacuum evaporation method. Also, as shown in FIG. 13E, a part of the resin composition 53 having the metallic reflecting layer or the like laminated thereon is cut and removed by, for example, performing a lapping treatment. As a result, as shown in FIG. 13F, the transparent substrate 37 is formed in which the concave mirror portions 38 are erected thereon so as to correspond in position to the organic EL element 45, respectively.

Figure 13F:
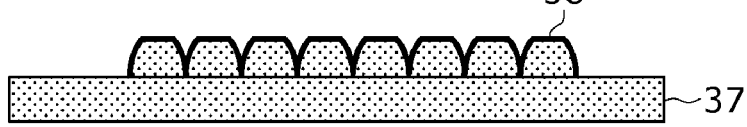
Figure 14A:
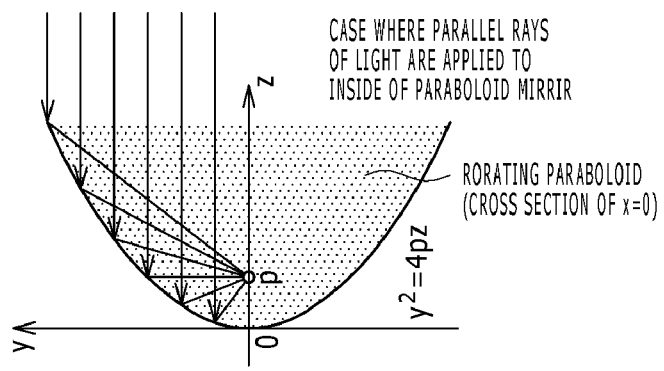
FIGS. 14A to 14D are respectively explanatory views showing an outline of an existing CPC structure.
Figure 14B:
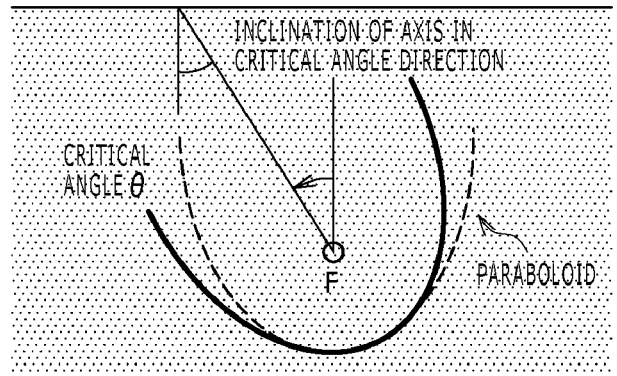
Figure 14C:
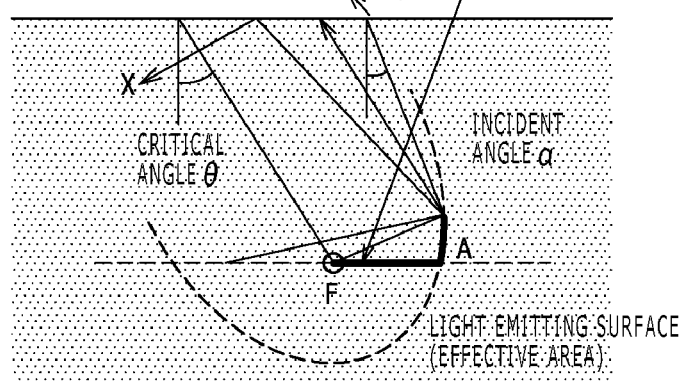
Figure 14D:
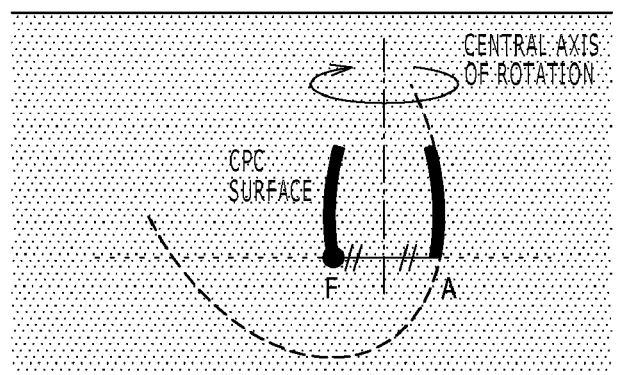
Figure 15:
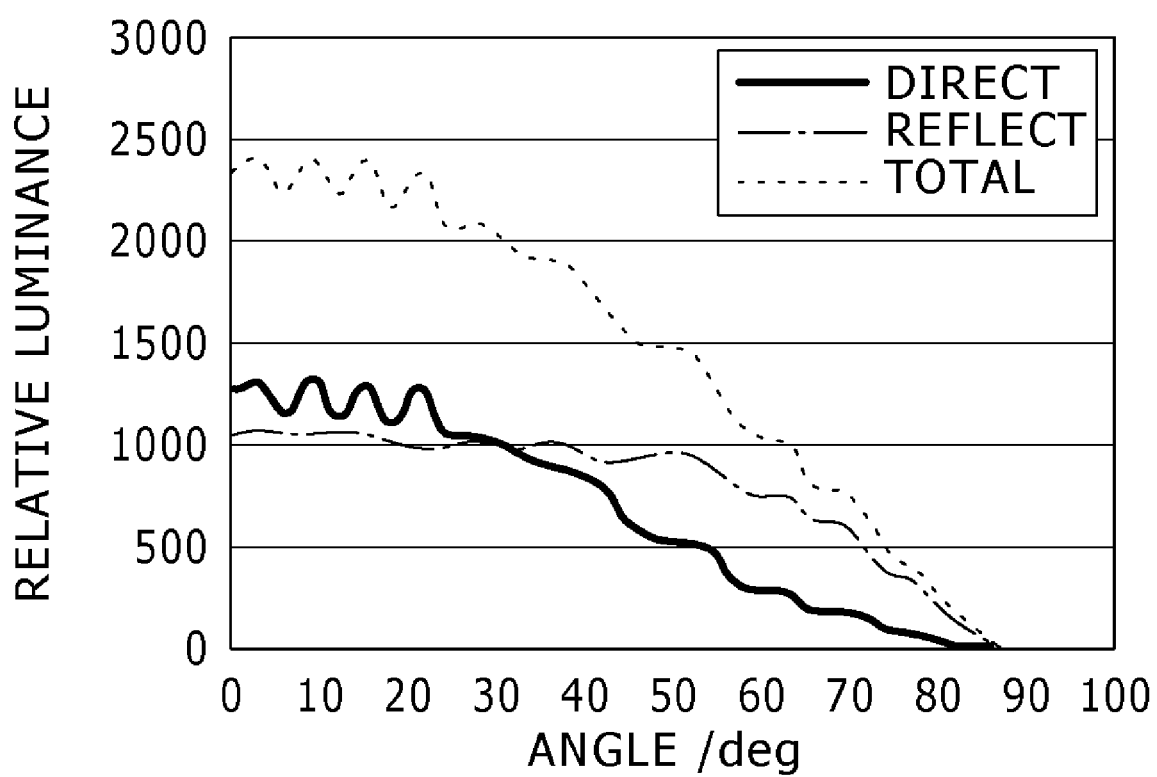
FIG. 15 is an explanatory view showing a concrete example of a light distribution component in the existing CPC structure.

After completion of the formation of the transparent substrate 37, the transparent substrate 37 is deposited on the side of the emission surfaces 45a of the organic EL elements 45 upside down contrary to the state shown in FIG. 13F through the adhesive layer 36 having the translucency. That is to say, the side of the emission surfaces 45a of the organic EL elements 45 is coated with the transparent substrate 37 through the adhesive layer 36. As a result, the organic EL display 1 is structured.

[Changes of Embodiment of the Invention]

It is noted that although the present invention has been described so far based on the preferred embodiment, the present invention is by no means limited to the contents of the preferred embodiment, and thus the preferred embodiment can be suitably changed without departing from the gist of the present invention.

For example, it is to be understood that each of the numeric values given in the embodiment is merely a concrete example, and thus the present invention is by no means limited thereto.

In addition, although the embodiment has been described so far by giving, as example, the case where the present invention is applied to the organic EL display 1 in which the organic EL elements 45 as the light emitting elements are disposed in matrix pattern, the present invention is by no means limited thereto.

For example, the OLED, the LED or the like may be used as the light emitting element as long as it emits a light from its emission surface.

Moreover, a plurality of light emitting elements need not to be necessarily disposed in matrix pattern, and thus a single light emitting element may be disposed. This fact means that the present invention can also be applied to a light emitting device including a single or plural (for example, one line disposition) light emitting elements, and a single or plural concave mirror portions disposed adjacent thereto as well as the display device including the light emitting elements disposed in pattern.

That is to say, in the case as well where the present invention is applied to the light emitting device used as the lighting equipment similarly to the case where the present invention is applied to the display device typified by the organic EL display 1, the offsetting of the central axis of the rotation of the parabola with which the light reflecting surface of the concave mirror portion erected on the circumference of the emission surface of the light emitting element is formed through the rotation makes it possible to more greatly enhance the luminance within the effective visual sense range than that in existing one. As a result, the bright lighting can be realized with the low power consumption.

Such enhancement of the luminance within the effective visual sense range is realized by using the shape of the light reflecting surface obtained by offsetting the central axis of the rotation of the parabola. However, the shape of the light reflecting surface may be approximated by a polygon or a reflecting mirror shape. In this case, the polygon is formed by combining a plurality set of high-order aspheric surfaces and planar surfaces with each other. Also, the reflecting mirror shape is formed by combining a plurality of circular cones with one another. That is to say, in the case as well of these approximate shapes, the luminance within the effective visual sense range can be realized similarly to the case of the light reflecting surface shape concerned as long as the approximate shape itself can be recognized equally to the shape of the light reflecting surface obtained by offsetting the central axis of the rotation of the parabola.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting device, comprising:
a light emitting element configured to emit a light; and
a concave mirror portion configured to reflect the light emitted from said light emitting element, said concave mirror portion being erected on a circumference of an emission surface of said light emitting element;
wherein said concave mirror portion has a light reflecting surface obtained by rotating a part of a parabola, and
a central axis of the rotation is set in a position of passing through a side of the parabola with respect to a middle point of a line segment joining the part of the parabola and a focal point of the parabola.

2. The light emitting device according to claim 1, wherein both said emission surface of said light emitting element and said light reflecting surface of said concave mirror portion are covered with a translucent member layer, and
a symmetric axis of the parabola is given inclination corresponding to a critical angle in an interface on a light emission side of said translucent member layer.

3. The light emitting device according to claim 2, wherein an amount of offset of the central axis of the rotation from the middle point is set based on a desired light distribution of an emitted light from the light emission side of said translucent member layer.

4. A display device, comprising:
a plurality of light emitting elements configured to emit lights, respectively, said plurality of light emitting elements being arranged in accordance with a predetermined rule; and
concave mirror portions configured to reflect the lights emitted from said plurality of light emitting elements, respectively, said concave mirror portions being erected on circumferences of emission surfaces of said plurality of light emitting elements so as to correspond to said plurality of light emitting elements, respectively;
wherein each of said concave mirror portions has a light reflecting surface obtained by rotating a part of a parabola, and
a central axis of the rotation is set in a position of passing through a side of the parabola with respect to a middle point of a line segment joining the part of the parabola and a focal point of the parabola.

5. The display device according to claim 4, wherein both said emission surface of said light emitting element and said light reflecting surface of said concave mirror portion are covered with a translucent member layer; and
a symmetric axis of the parabola is given inclination corresponding to a critical angle in an interface on a light emission side of said translucent member layer.

6. The display device according to claim 5, wherein an amount of offset of the central axis of the rotation from the middle point is set based on a desired light distribution of an emitted light from the light emission side of said translucent member layer.

7. A method of manufacturing a display device including a plurality of light emitting elements configured to emit lights, respectively, said plurality of light emitting elements being arranged in accordance with a predetermined rule, and concave mirror portions configured to reflect the lights emitted from said plurality of light emitting elements, respectively, said concave mirror portions being erected on circumferences of emission surfaces of said plurality of light emitting elements so as to correspond to said plurality of light emitting elements, respectively, said method comprising the steps of:
forming a light reflecting surface of each of said concave mirror portions to have a shape obtained by rotating a part of a parabola; and
setting a central axis of the rotation in a position of passing through a side of the parabola with respect to a middle point of a line segment joining the part of the parabola and a focal point of the parabola.

* * * * *